(12) United States Patent
Ohashi et al.

(10) Patent No.: US 7,651,249 B2
(45) Date of Patent: Jan. 26, 2010

(54) LIQUID CRYSTAL DISPLAY DEVICE

(75) Inventors: Shigeo Ohashi, Tsuchiura (JP); Noriyo Nishijima, Abiko (JP); Shigeyuki Sasaki, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/120,685

(22) Filed: May 15, 2008

(65) Prior Publication Data
US 2008/0285290 A1 Nov. 20, 2008

(30) Foreign Application Priority Data
May 15, 2007 (JP) .............................. 2007-129105

(51) Int. Cl.
*F21V 29/00* (2006.01)
(52) U.S. Cl. .................. 362/373; 362/613; 362/632
(58) Field of Classification Search .................. 362/29, 362/30, 97.1, 97.2, 97.3, 294, 362, 373, 561, 362/632, 633, 634; 361/684, 695, 696, 697, 361/717, 690
See application file for complete search history.

(56) References Cited

U.S. PATENT DOCUMENTS

2005/0225963 A1* 10/2005 Huang et al. ................ 362/294
2006/0070280 A1* 4/2006 Yamamura et al. .......... 361/695
2007/0076431 A1* 4/2007 Atarashi et al. ............. 362/373
2008/0089028 A1* 4/2008 Kim et al. ................... 361/695

FOREIGN PATENT DOCUMENTS

JP 2006-189850 7/2006

* cited by examiner

*Primary Examiner*—Y My Quach Lee
(74) *Attorney, Agent, or Firm*—Antonelli, Terry, Stout & Kraus, LLP.

(57) ABSTRACT

If a forced convection is generated by a cooling fan, there is generated a problem that a natural convection is prevented and a cooling effect in a region of the natural convection is lowered. The invention provides a structure in which an air flow generated by a forced convection does not come into contact with an air flow generated by a natural convection, by setting a partition all between a forced convection path in which the air flows on the basis of a forced convection generated by a cooling fan, and a natural convection path in which the air flows on the basis of a natural convection. Further, the partition wall is not provided near an upper end so as to draw in the air flowing through the natural convection path to a side of the forced convection path, thereby promoting the natural convection of the natural convection path.

6 Claims, 10 Drawing Sheets

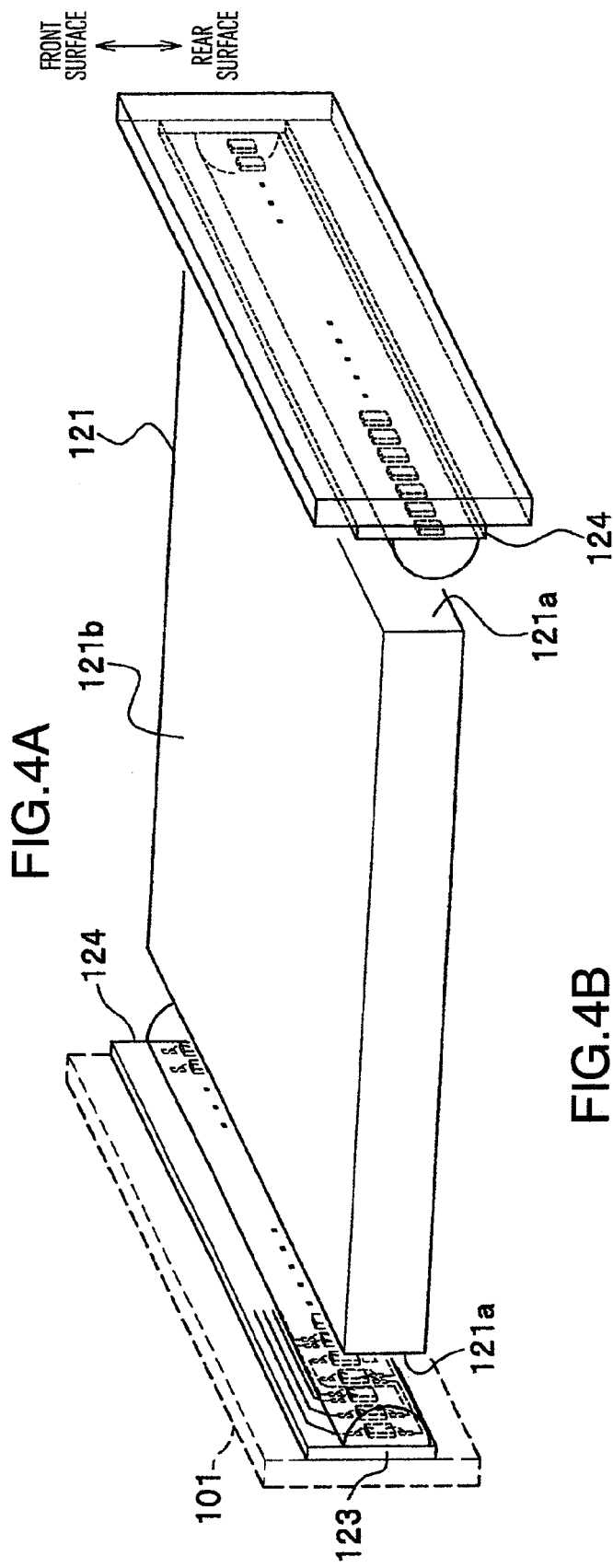
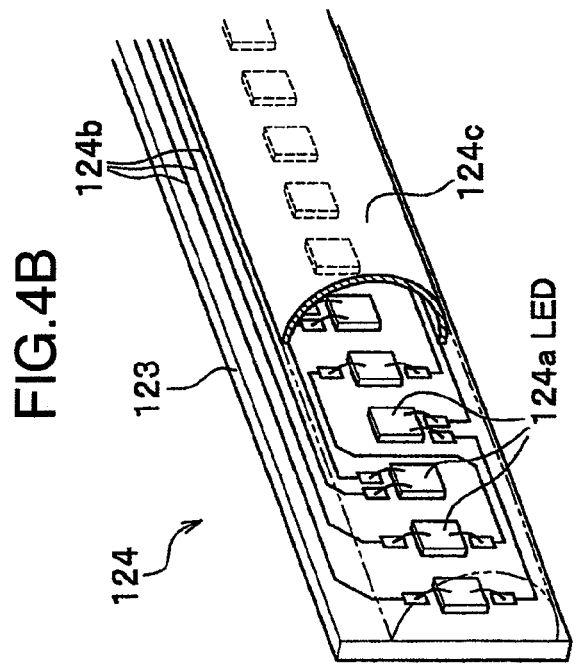
FIG.4A
FIG.4B

LIQUID CRYSTAL DISPLAY DEVICE

BACKGROUND OF THE INVENTION (1) Field of the Invention

The present invention relates to a liquid crystal display device having a cooling mechanism.

(2) Description of Related Art

In recent years, as a display device, a luminous type plasma display panel or a non-luminous type liquid crystal display device have been frequently used in place of a cathode ray tube (CRT).

Among them, the liquid crystal display device employs a liquid crystal panel as a transmission type light modulation element, and is provided with a lighting device (also called as a back light) on a back surface of the liquid crystal panel so as to irradiate a light onto the liquid crystal panel. Further, the liquid crystal panel forms an image by controlling a transmission rate of the light irradiated from the back light.

One of the features of the liquid crystal display device exists in a point that an outer shape can be structured thinner than the CRT. However, a further thinner liquid crystal display device is desired in recent years. If the liquid crystal display device is made thinner, it becomes hard to secure an air flow path for cooling an inner portion of a casing constructing an outer shape of the liquid crystal device. Accordingly, there generated a problem that a cooling efficiency is lowered. In this connection, for example, patent document 1 (JP-A-2006-189850 (refer to FIGS. 5 to 7)) discloses a technique in which a transverse flow fan for exhausting is provided in an upper portion of a rear surface so as to forcibly generate a convection current in an inner portion of a casing and increase an amount of an air flowing in the inner portion of the casing, thereby cooling the inner portion of the casing.

However, in the technique disclosed in the patent document 1, it is necessary to set a rotating space for rotating the transverse flow fan around a shaft provided in a lateral direction of the liquid crystal display device, and a space for arranging a rotating mechanism rotating the transverse flow fan, and there is generated an obstructing factor against the desire for making the liquid crystal display device thin.

In this connection, there is considered a structure in which a blower device taking an air from a rear surface of the liquid crystal display device so as to exhaust the air to an upper side is installed near a lower end of the liquid crystal display device, for making the liquid crystal device thin. This structure is structured such as to cool the inner portion of the casing by using both a forced convection generated by the blower device and a natural convection generated in the inner portion of the casing, however, if the blower device is installed near the lower end of the liquid crystal display device, the natural convection is disturbed by the flow of the forced convection generated by the blower device, and there is a problem that a whole of the inner portion of the casing of the liquid crystal display device can not be efficiently cooled.

BRIEF SUMMARY OF THE INVENTION

Accordingly, an object of the present invention is to provide a liquid crystal display device having a cooling mechanism in which a natural convection in an inner portion of a casing is not prevented by a blower device.

In order to achieve the object mentioned above, the present invention provides a liquid crystal display device having a cooling mechanism blowing to an inner portion of a casing, in such a manner as to prevent a blower device from disturbing a natural convection.

Specifically, in accordance with one aspect of the present invention, there is provided a liquid crystal display device comprising:

a liquid crystal panel;

a light guide plate provided in a rear surface of the liquid crystal panel;

a plurality of light sources arranged in such a manner as to input a beam of light to the light guide plate from both side surfaces of the light guide plate;

a substrate on which the light source is mounted;

a heat sink connected to a surface of the substrate on which the light source is not mounted;

a blower device for blowing an air cooling the heat sink; and these elements being stored in a casing, wherein an air intake port is open to a lower side of the casing, and an exhaust port is open to an upper side, wherein an inner portion of the casing comprises:

a natural convection path in which an air taken into the inner portion of the casing via the air intake port rises in a rear surface side of the light guide plate on the basis of a natural convection, and is exhausted from the exhaust port; and a forced convection path in which the air taken into the inner portion of the casing by the blower device rises on the basis of a forced convection caused by the ventilation of the blower device while being along the heat sink extending from a lower side toward an upper side, and is exhausted from the exhaust port, and wherein the natural convection path and the forced convection path are comparted by a partition wall.

In the liquid crystal display device in accordance with the present invention, it is preferable that a region in which the partition wall is not formed exists in an upper side of the natural convection path and the forced convection path, and the natural convection in the natural convection path is promoted by drawing in the air flowing in the natural convection path to the forced convection path side, in the region in which the partition wall is not formed.

In the liquid crystal display device in accordance with the present invention, it is preferable that the casing includes a rear cover provided in a rear surface of the light guide plate, the heat sink had a heat dissipation portion extending to a portion between the light guide plate and the rear cover, the heat dissipation portion has a plurality of fins formed in a vertical direction, the natural convection path and the forced convection path are formed between the light guide plate and the rear cover, and the air flowing in the natural convection path and the forced convection path rises along the fins.

In the liquid crystal display device in accordance with the present invention, it is preferable that an installation interval of the fins in the forced convection path is narrower than an installation interval of the fins in the natural convection path.

In accordance with the present invention, there can be provided with the liquid crystal display device having the cooling mechanism in which the natural convection in the inner portion of the casing is not prevented by the blower device.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIG. 4A is a view showing a layout of a light source and a light guide plate;

FIG. 4B is a view showing the light source;

DETAILED DESCRIPTION OF THE INVENTION

A description will be in detail given below of a best mode for carrying out the present invention approximately using the accompanying drawings.

Figure 1:
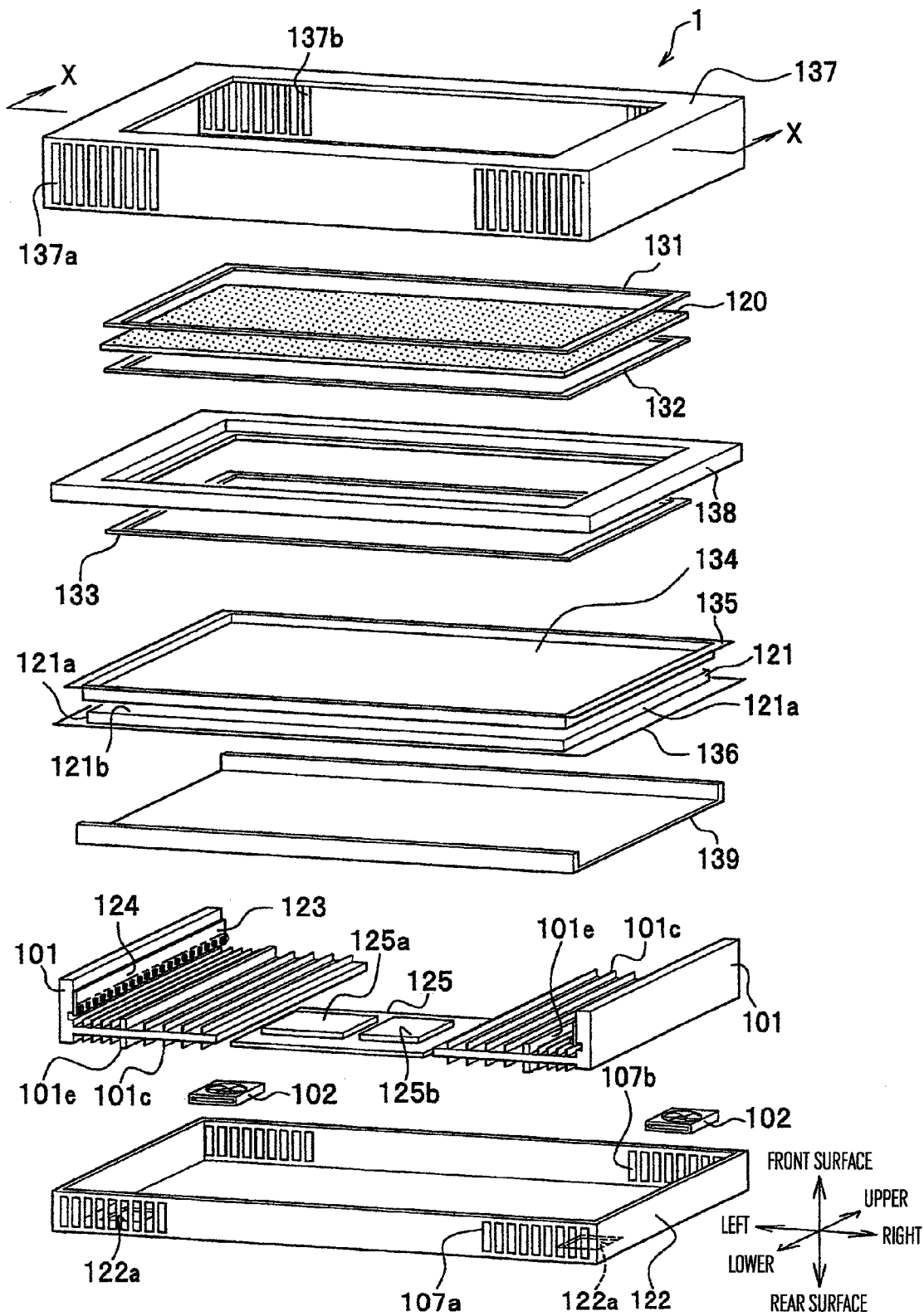
FIG. 1 is a perspective view of a structure of a liquid crystal display device in accordance with the present embodiment.
Figure 2:
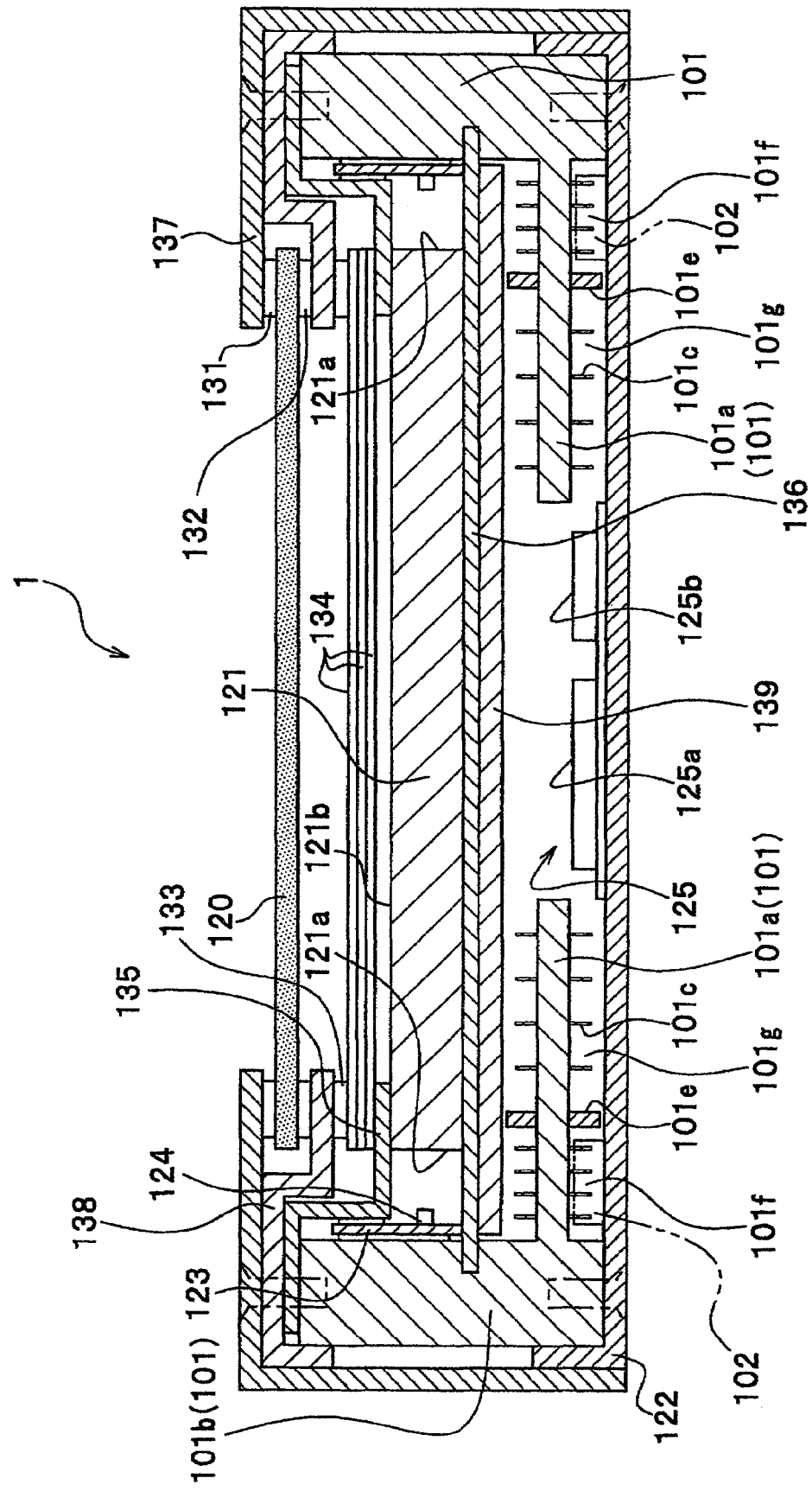
FIG. 2 is a cross sectional view along a line X-X in FIG. 1.
Figure 3A:
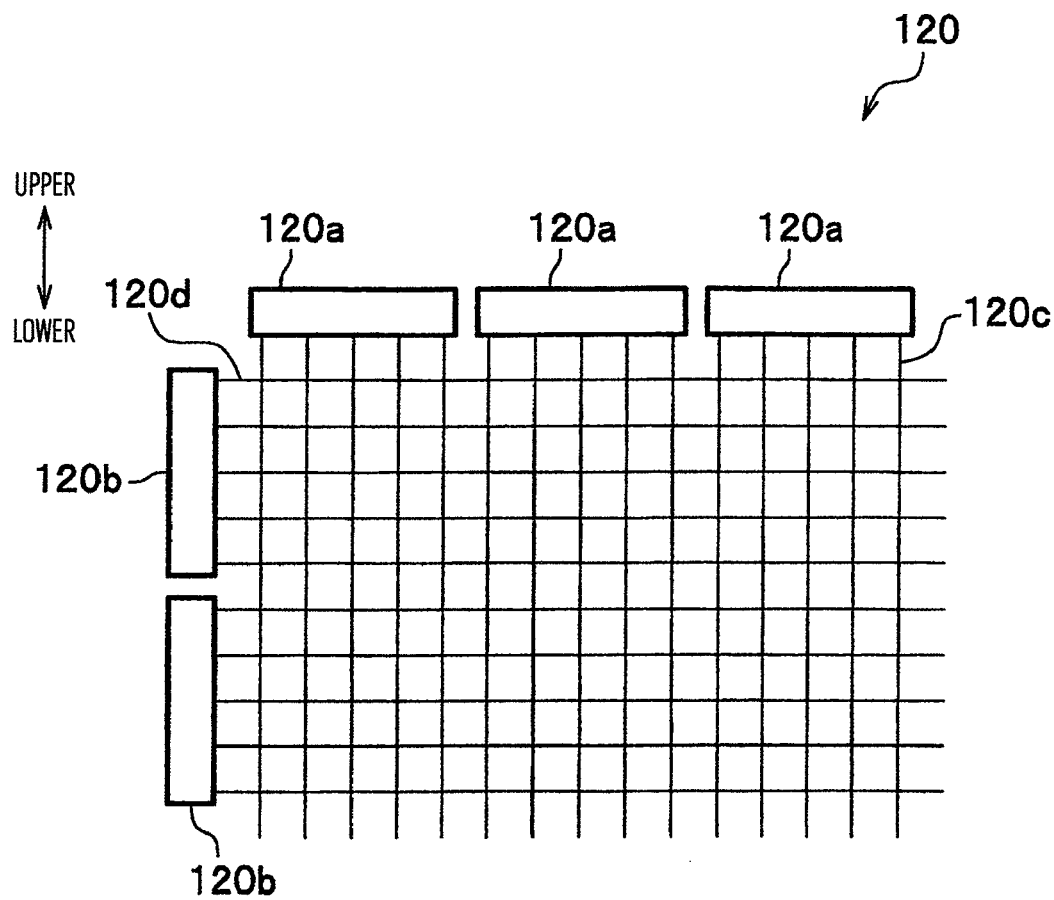
FIG. 3A is a view showing a wiring of a liquid crystal panel and a layout of a drive circuit.
Figure 3B:
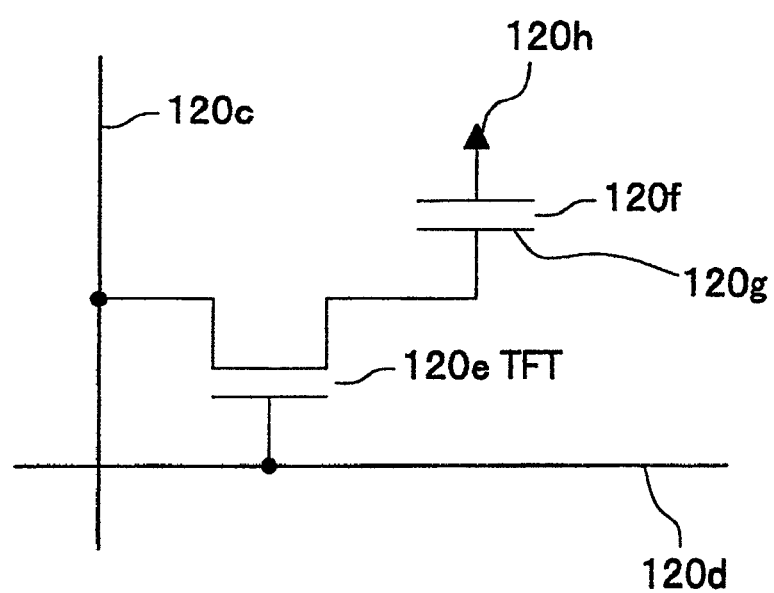
FIG. 3B is a view showing a layout of a TFT and a pixel electrode.
Figure 5:
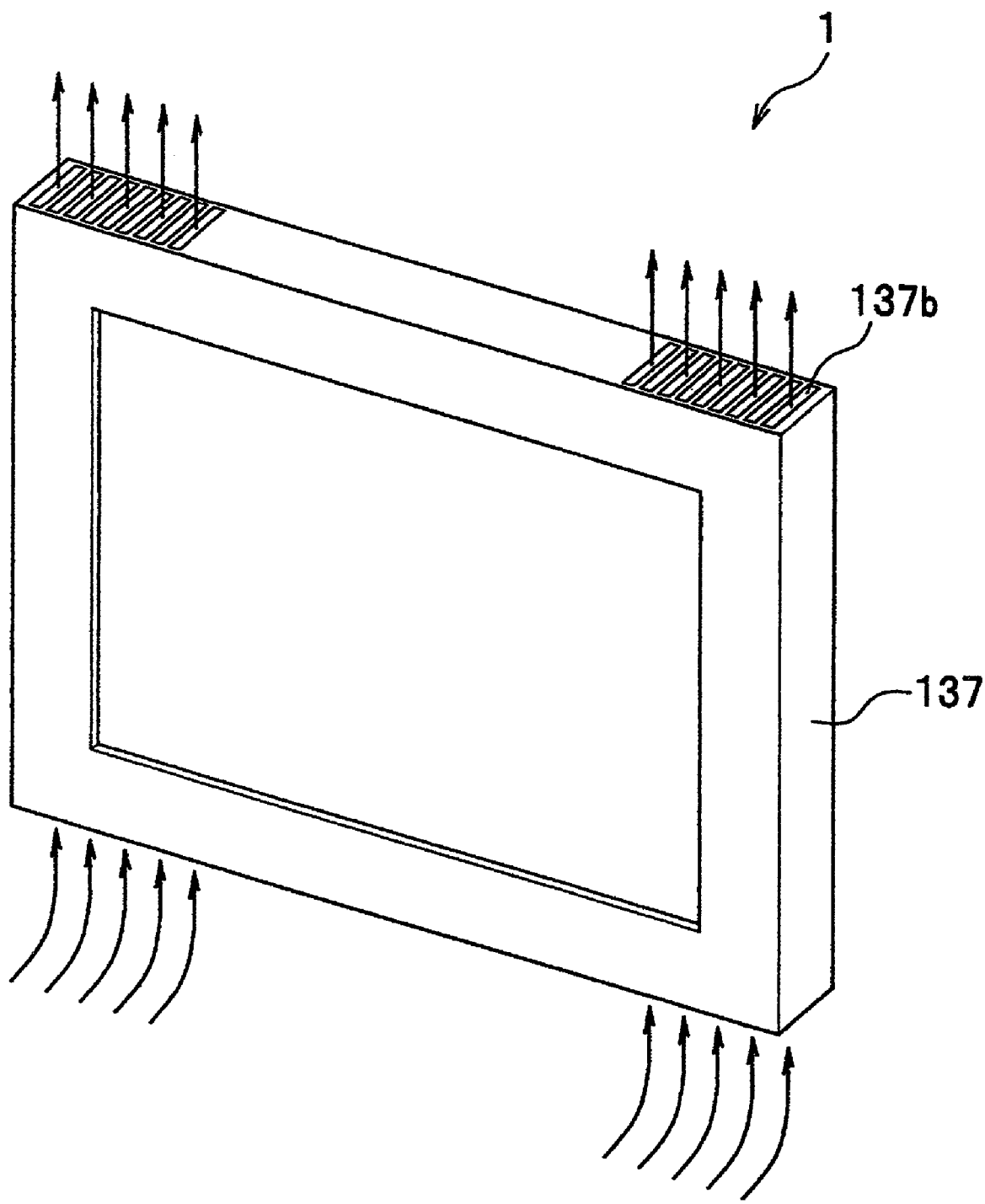
FIG. 5 is a view showing an air supply and exhaust of the liquid crystal display device.

FIG. 1 is a perspective view of a structure of a liquid crystal display device in accordance with the present embodiment, FIG. 2 is a cross sectional view along a line X-X in FIG. 1, FIG. 3A is a view showing a wiring of a liquid crystal panel and a layout of a drive circuit, FIG. 3B is a view showing a layout of a thin film transistor (TFT) and a pixel electrode, FIG. 4A is a view showing a layout of a light source and a light guide plate, FIG. 4B is a view showing the light source, and FIG. 5 is a view showing an air supply and exhaust of the liquid crystal display device. In the present embodiment, as shown in FIG. 1, upper, lower, left, right, front and rear surfaces are defined on the basis of a display screen of a liquid crystal panel 120.

As shown in FIG. 1, a liquid crystal display device 1 in accordance with the present embodiment is structured such as to include the liquid crystal panel 120, a light guide plate 121, a rear cover 122, a light source 124, a substrate 123 for mounting the light source, and heat sinks 101 and 101. Further, the liquid crystal display device 1 is provided with a first frame 137, a first rubber cushion 131, a second rubber cushion 132, a second frame 138, an optical sheet 134, a first reflection sheet 135, a second reflection sheet 136, and a third frame 139.

Although details will be described below, the light guide plate 121 is arranged on a rear surface of the liquid crystal panel 120, and the substrate 123 having the light source 124 is arranged in right and left side surfaces of the light guide plate 121. In this case, a side surface of the light guide plate 121 in which the light source 124 is arranged is called as an incident surface 121a. Further, a surface close to the liquid crystal panel 120 is called as an outgoing surface 121b.

Further, as shown in FIG. 2, a space is provided between the light guide plate 121 and the rear cover 122, and the heat sink 101 is extended to the space. Further, a space is provided in a front surface and a rear surface of the heat sink 101.

The liquid crystal panel 120 has a structure in which a liquid crystal is sandwiched between two glass substrates, and has a function of a light shutter controlling a transmission and interruption of the light outgoing from the light guide plate 121 on the basis of a control of an oriented state of a liquid crystal molecule constructing the liquid crystal.

As shown in FIG. 3A, the liquid crystal panel 120 is structured such that a signal wiring 120c and a scanning wiring 120d are wired like a grid shape, and is provided with a signal wiring drive circuit 120a for driving the signal wiring 120c and a scanning wiring drive circuit 120b for driving the scanning wiring 120d.

Further, as shown in FIG. 3B, a TFT 120e driving a liquid crystal 120f is connected to a grid point between the signal wiring 120c and the scanning wiring 120d. The TFT 120e is structured such that if a voltage is applied to the scanning wiring 120d, a current flows to a counter electrode 120h from the signal wiring 120c through a pixel electrode 120g and a shutter of the liquid crystal 120f is opened, in the case that the voltage of the signal wiring 120c is positive. If the shutter of the liquid crystal 120f is opened, a clear pixel is obtained while transmitting a light generation emitted from the outgoing surface 121b of the light guide plate 121 shown in FIG. 1. On the other hand, in the case that the voltage of the signal wiring 120c is "0" or negative, the current does not flow to the counter electrode 120h even if the voltage is applied to the scanning wiring 120d, so that the shutter of the liquid crystal 120f is not opened and a dark pixel is obtained.

As mentioned above, the liquid crystal 120f is structured such as to be controlled on the basis of the voltage applied to the scanning wiring 120d and the signal wiring 120c.

The scanning wiring drive circuit 120b has a function of scanning in such a manner as to apply a predetermined voltage to one of the scanning wiring 120d, at a fixed period, for example, sequentially from an upper side toward a lower side. Further, the signal wiring drive circuit 120a functions in such a manner as to apply a predetermined voltage to the signal wiring 120c corresponding to the clear pixel and not to apply the voltage to the signal wiring 120c corresponding to the dark pixel, on the scanning wiring 120d to which the scanning wiring drive circuit 120b applies a predetermined voltage.

In accordance with the structure mentioned above, the clear pixel and the dark pixel can be set by the scanning wiring 120d to which the voltage is applied. Further, it is possible set the clear pixel and the dark pixel to all the scanning wiring 120d by controlling the voltage which the signal wiring drive circuit 120a applies to each of the signal wiring 120c, and an image can be constructed on the liquid crystal panel 120.

In this case, the signal wiring drive circuit 120a and the scanning wiring drive circuit 120b may be structured, for example, such that a control device 125a (refer to FIG. 1) controls.

For example, the control device 125a has a function of managing an image signal displayed on the liquid crystal panel 120 as a brightness information per the liquid crystal 120f (refer to FIG. 3B). Further, the signal wiring drive circuit 120a may be structured such as to be controlled so that a predetermined voltage is applied to each of the signal wiring 120c in correspondence to the brightness information of the signal wiring 120c on the scanning wiring 120d applying the predetermined voltage, as well as scanning in such a manner as to apply the predetermined voltage to one of the scanning wiring 120d sequentially from the upper side toward the lower side by controlling the scanning wiring drive circuit 120b.

Returning to FIG. 1, the light guide plate 121 is made of a transparent resin such as an acrylic or the like, and has a function of converting a beam of light (a point light source) outgoing from the light source 124 into a surface light source. Further, as shown in FIG. 2, the light guide plate 121 is arranged on a rear surface of the liquid crystal panel 120 via a second frame 138, a second rubber cushion 132 and an optical sheet 134, and has a function of converting the beam of light (the point light source) emitted by the light source 124 into the surface light source. Accordingly, the substrate 123 having the light source 124 is arranged in right and left side surfaces of the light guide plate 121. In this case, as mentioned above, the light guide plate 121 has an incidence surface 121a and an outgoing surface 121b.

Further, as shown in FIG. 4A, the light source 124 is provided so as to be along the incidence surface 121a of the light guide plate 121, and the structure is made such that the beam of light emitted by the light source 124 is input to the light guide plate 121 via the incidence surface 121a. In this case, the light source 124 has a function of emitting the light for displaying the image by the liquid crystal panel 120.

The light source 124 is structured, as shown in FIG. 4B, such that a plurality of LED 124a (for example, three colors having red (R), green (G) and blue (B) are alternately arranged) are fixed onto the substrate 123, and are electrically connected to a wiring pattern 124b formed on the substrate 123 in accordance with a bonding or the like. Further, a lens 124c for suitably scattering the light generation covers an upper portion of the light generation surface. The current and voltage are fed to the light source 124 via the wiring pattern 124b, and the light source 124 can emit light. The substrate 123 can employ, for example, a ceramic substrate having a low heat resistance, and it is possible to effectively conduct the heat generated in the light source 124 to the heat sink 101 by fixing so as to come into contact with the heat sink 101 as shown in FIG. 4A.

The beam of light incoming to the light guide plate 121 from the incident surface 121a is propagated while repeating a reflection within the light guide plate 121, is scattered by a reflection dot (not shown) printed in the rear surface side of the light guide plate 121 and is emitted from the outgoing surface 121b provided in the front surface side of the light guide plate 121. Further, as shown in FIG. 2, a second reflection sheet 136 is arranged in the rear surface of the light guide plate 121, and efficiently irradiates the liquid crystal panel 120 (refer to FIG. 1) by again returning the beam of light which is deviated from a total reflection condition so as to outgo to the rear surface of the light guide plate 121 to the light guide plate 121.

As mentioned above, in accordance with the present embodiment, the structure is made such that the beam of light emitted from the outgoing surface 121b of the light guide plate 121 irradiates the liquid crystal panel 120 from the rear surface.

Returning again to FIG. 1, the rear cover 122 is made, for example, of a resin, and serves as a protection cover of the rear surface of the liquid crystal display device 1. Further, an air intake port 107a for taking the air is provided in a lower surface of the rear cover 122, and an exhaust port 107b for exhausting the air is provided in an upper surface of the rear cover 122.

The first frame 137 is made, for example, of a resin, is arranged in a front surface of the liquid crystal panel 120, and has a function of serving as a front cover of the liquid crystal display device 1. Further, the first frame 137 is formed as a shape that a display area portion of the liquid crystal display device 1 is open. Further, an air intake port 137a for taking the air is provided in a lower surface of the first frame 137, and an exhaust port 137b for exhausting the air is provided in an upper surface of the first frame 137.

Further, a casing is formed by combining the first frame 137 and the rear cover 122. Further, when the casing is formed, the exhaust port 137b of the first frame 137 is communicated with the exhaust port 107b of the rear cover 122, and the air intake port 137a of the first frame 137 is communicated with the air intake port 107a of the rear cover 122.

In this case, the rear cover 122 may be constructed, for example, as a plate-like member, and may be structured such that the air intake port 137a and the exhaust port 137b are open only to the first frame 137.

The first rubber cushion 131 is arranged in the front surface of the liquid crystal panel 120, and has a function of serving as a support member of the first frame 137 and the liquid crystal panel 120. The second rubber cushion 132 is arranged in the rear surface of the liquid crystal panel 120, and has a function of serving as a cushioning material of the liquid crystal panel 120 and the second frame 138.

The second frame 138 has a function of supporting the liquid crystal panel 120, and has a function of a heat insulating material preventing the heat from the heat sink 101 from being conducted to the liquid crystal panel 120 by being interposed between the heat sink 101 and the liquid crystal panel 120.

The optical sheet 134 is arranged in a rear surface of the second frame 138, and has an orientation applying function of further uniformizing the light outgoing from the light guide plate 121 or improving a brightness in a front surface direction. In this case, the number of the optical sheet 134 is not limited, and three optical sheets 134 are arranged as shown in FIG. 2 in the present embodiment. Further, a cushioning body 133 made of an elastic member such as a rubber or the like is arranged between the second frame 138 and the optical sheet 134, and absorbs an impact, for example, input from the first frame 137.

The first reflection sheet 135 is arranged in a rear surface of the optical sheet 134. The first reflection sheet 135 has a function of reflecting the beam of light which does not income to the light guide plate 121 in the beam of light outgoing from the light source 124 so as to input to the light guide plate 121, and a function of again returning the beam of light emitting from the emitting surface 121b of the light guide plate 121 near the light source 124 to the light guide plate 121. The emitting light of RGB becomes non-uniform near the light source 124, and this portion can not be set to a display surface. Accordingly, it is possible to reduce a loss of the beam of light by returning the beam of light near the light source 124 to the light guide plate 121 by the first reflection sheet 135.

The second reflection sheet 136 is arranged in the rear surface of the light guide plate 121. The second reflection sheet 136 has a function of improving a utilization efficiency of the beam of light by reflecting the beam of light which does not directly income to the light guide plate 121 in the beam of light outgoing from the light source 124 so as to input to the light guide plate 121, and a function of again returning the beam of light deviating from the total reflection condition and outgoing to the lower surface of the light guide plate 121 to the light guide plate 121.

The heat sink 101 is formed by a metal material, for example, a copper, an aluminum or the like, which is excellent in a heat conductivity, and has a function for efficiently dissipating the heat generation of the light source 124. Further, the heat sink 101 is connected to a surface in which the light source 124 of the substrate 123 is not mounted as mentioned above, for example, by using a heat conduction adhesion member, and has a function of dissipating heat by conducting the heat generation of the light source 124 to the heat sink 101.

Further, the heat sink 101 has a role of protecting the liquid crystal panel 120 and the light guide plate 121 at a time when a load is applied to the liquid crystal display device 1, by accommodating the liquid crystal panel 120 and the light guide plate 121 in an inner portion of a virtual rectangular parallelepiped region which comes into outside contact with the heat sink 101.

In this case, the heat sink 101 has a structure having an approximately L-shaped form in a top elevational view, and a bent portion of the heat sink 101 is extended to a portion between the light guide plate 121 and the rear cover 122, as shown in FIG. 2. The portion extended to the portion between the light guide plate 121 and the rear cover 122 is set to a heat dissipation portion 101a, and the other portions are set to a heat transfer portion 101b. Further, a plurality of fins 101c are provided in the heat dissipation portion 101a of the heat sink 101. The fin 101c is constituted by a thin plate-shaped member provided vertically in the heat dissipation portion 101a, and is formed in such a manner as to extend from the lower side of the liquid crystal display device 1 toward the upper side. As mentioned above, it is possible to increase a surface area of the heat dissipation portion 101a so as to increase the heat dissipation effect, by setting the fin 101c. Further, the structure is made such that a gap is formed from a lowest end of the liquid crystal panel 120 to a highest end around the heat sink 101 arranged between the light guide plate 121 and the rear cover 122.

Further, a cooling fan 102 is provided in the heat transfer portion 101b of the heat dissipation portion 101a, and a partition wall 101e is formed in a center side thereof. The cooling fan 102 and the partition wall 101e are described later.

Further, as shown in FIG. 2, since the light source 124 is fixed to the heat transfer portion 101b of the heat sink 101 via the substrate 123, the heat generated in the light source 124 is conducted to the heat dissipation portion 101a via the heat transfer portion 101b, is thereafter scattered to a plurality of fins 101c, and is dissipated to the air flowing along the fins 101c between the light guide plate 121 and the rear cover 122. The air flowing between the light guide plate 121 and the rear cover 122 flows from the lower side to the upper side on the basis of the natural convection.

In other words, as shown in FIG. 5, an ambient air is taken into the inner portion of the liquid crystal display device 1 through the air intake port 137a (refer to FIG. 1) which is open to the first frame 137 and the air intake port 107a (refer to FIG. 1) which is open to the rear cover 122, and is exhausted through the exhaust port 137b which is open to the first frame 137 and the exhaust port 107b (refer to FIG. 1) which is open to the rear cover 122.

Figure 6:
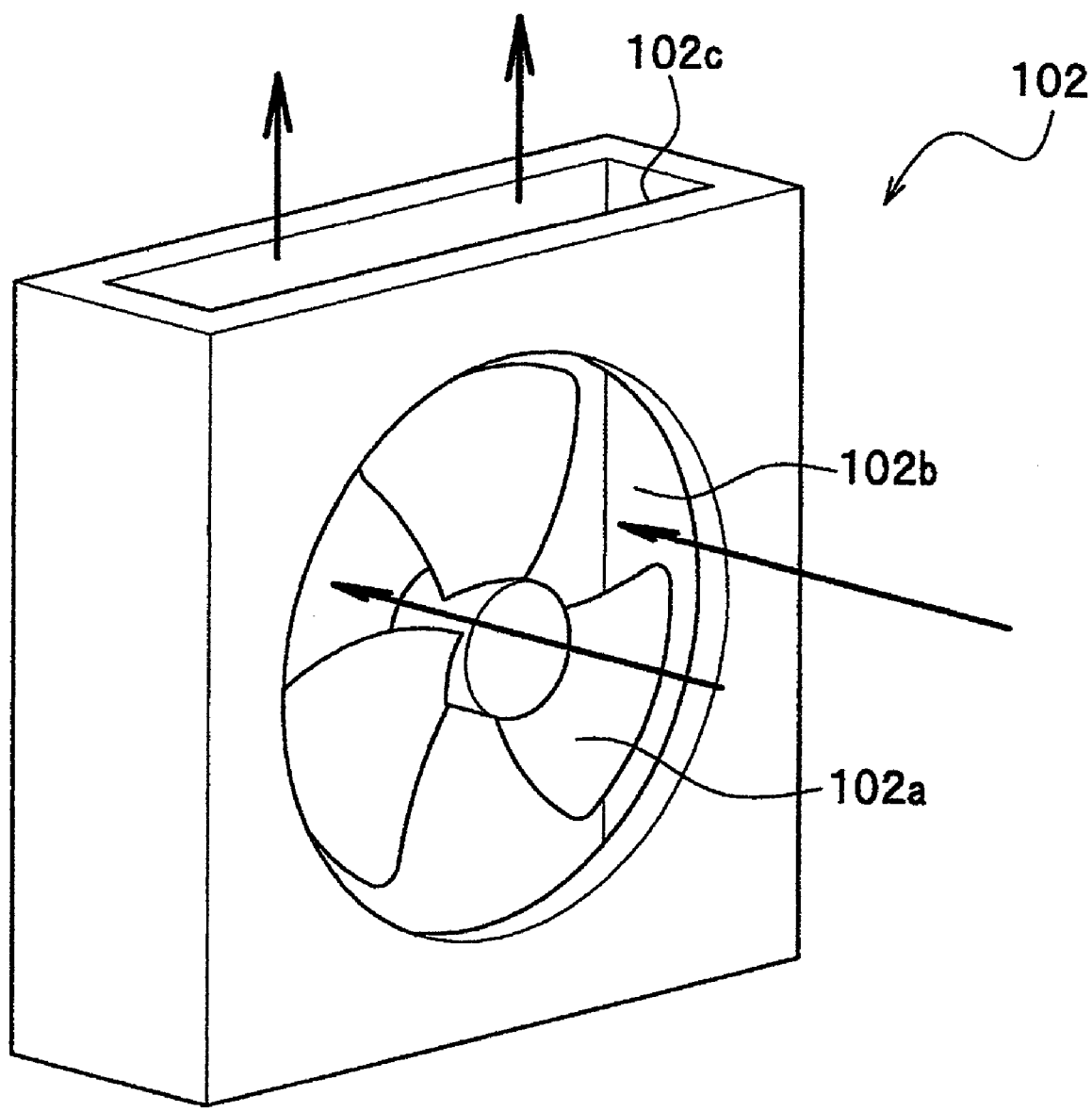
FIG. 6 is a view showing a cooling fan.
Figure 7A:
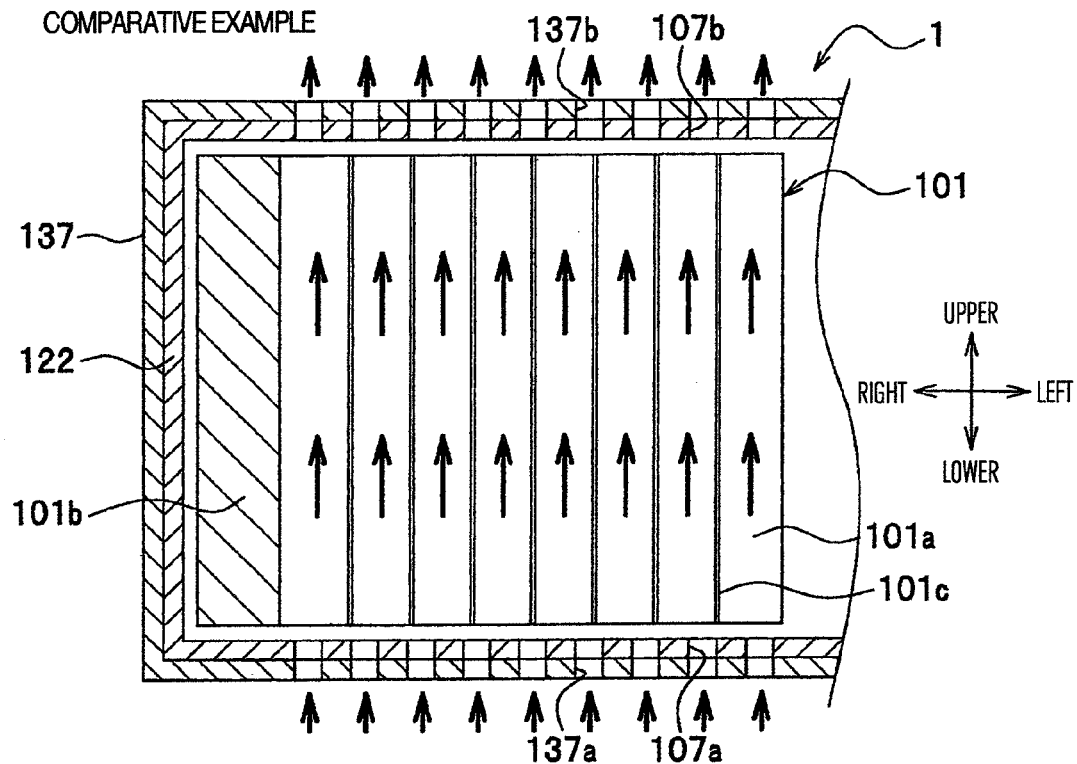
FIG. 7A is a view of a right half of the liquid crystal display device provided with no cooling fan from which a rear cover is detached, as seen from a rear surface, in accordance with a comparative example.
Figure 7B:
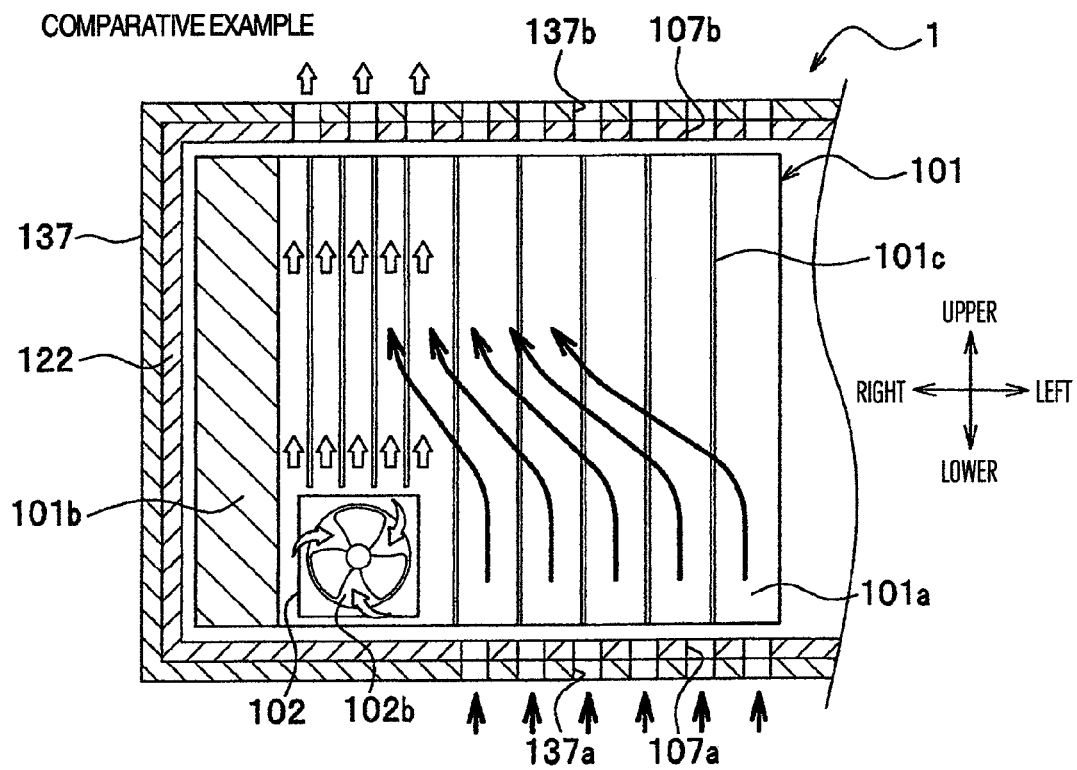
FIG. 7B is a view of the liquid crystal display device to which the cooling fan is attached, in accordance with the other comparative example.

Further, as shown in FIG. 7B, in the present embodiment, the cooling fan 102 (the blower device) is provided below both end portions of the rear surface of the liquid crystal display device 1. The cooling fan 102 has a function of generating the forced convection heating for the upper side by taking the ambient air into the cooling fan 102 from the outer portion of the liquid crystal display device 1 (refer to FIG. 7B) and exhausting the intake ambient air toward the upper side in the inner portion of the liquid crystal display device 1. FIG. 6 is a view showing the cooling fan. As shown in FIG. 6, the cooling fan 102 used in the liquid crystal display device 1 has an outer shape, for example, of a thin rectangular parallelepiped, and is structured such that the blade 102a is rotated by a rotating means such as a fan motor (not shown) or the like within a plane, thereby taking the ambient air therein from the air intake port 102b existing in the flat surface and exhausting the air from the exhaust port 102c existing in the side surface. If the blade 102a of the cooling fan 102 is rotated, the air taken from the air intake port 102b is exhausted from the exhaust port 102c as shown by an arrow in the drawing. As mentioned above, the cooling fan 102 can be provided without making the liquid crystal display device 1 thick by using the cooling fan 102 of the thin rectangular parallelepiped.

In this case, since the cooling fan 102 is arranged in the inner side of the rear cover 122 (refer to FIG. 1), a fan air intake port 122a is open to a position corresponding to the cooling fan of the rear cover 122, as shown in FIG. 1.

As mentioned above, in accordance with the present embodiment, between the light guide plate 121 and the rear cover 122, there is provided the gap for letting out the heat in the vertical direction with respect to the display screen of the liquid crystal panel 120, that is, the ventilation path, as shown in FIG. 2. Further, since the flow of the air caused by the forced convection generated in the cooling fan 102 (refer to FIG. 1) flows through the ventilation path, in addition to the flow in the ventilation path of the of the air caused by the natural convection flowing from the air intake port 137a (refer to FIG. 1) which is open to the first frame 137 and the air intake port 107a (refer to FIG. 1) which is open to the rear cover 122, to the exhaust port 137b (refer to FIG. 1) which is open to the first frame 137 and the exhaust port 107b (refer to FIG. 1) which is open to the rear cover 122, the structure is made such that heat sink 101 arranged in the ventilation path is cooled.

Further, in the present embodiment, the partition wall 101e is provided as shown in FIG. 2, thereby separating the ventilation path in which the air flows on the basis of the forced convection generated by the cooling fan 102 and the ventilation path in which the air flows on the basis of the natural convection. Hereinafter, the ventilation path in which the air flows on the basis of the forced convection generated by the cooling fan 102 is called as a forced convection path 101f, and the ventilation path in which the air flows on the basis of the natural convection is called as a natural convection path 101g.

FIG. 7A is a view of a right half of the liquid crystal display device provided with no cooling fan from which the rear cover is detached, as seen from the rear surface, in accordance with a comparative example, and FIG. 7B is a view of the liquid crystal display device to which the cooling fan is attached, in accordance with the other comparative example. As mentioned above, since the air intake ports 137a and 107a are provided in the lower side of the first frame 137 and the rear cover 122, and the exhaust ports 137b and 107b are provided in the upper side surface, the flow of the air heading for the upper side from the lower side is generated by the natural convection in the inner portion of the liquid crystal display device 1. Further, as shown by an arrow in FIG. 7A, the air rises along the fin 101c provided in the heat dissipation portion 101a. The heat conducted to the heat dissipation portion 101a from the heat transfer portion 101b is cooled by the air rising along the fin 101c.

However, as shown in FIG. 2, since the light source 124 is fixed to the heat transfer portion 101b of the heat sink 101, and the heat transfer portion 101b tends to become warm due to the heat generation of the light source 124, the cooling fan 102 is provided as shown in FIG. 7B in a side close to the heat transfer portion 101*b*, for effectively cooling the heat sink 101.

The cooling fan 102 has the structure as shown in FIG. 6, and is fixed in such a manner as to direct the air intake port 102*b* toward the rear surface of the liquid crystal display device 1 as shown in FIG. 7B. Further, it is possible to generate the flow caused by the forced convection heading for the upper side of the liquid crystal display device 1 as shown by a thick arrow in FIG. 7B, by driving the cooling fan 102. Further, since in the first frame 137, the exhaust port 137*b* is provided in the upper side of the cooling fan, and the exhaust port 107*b* is provided in the upper side of the cooling fan 102, it is possible to exhaust the air flowing to the upper side by the forced convection.

In this case, since the flow of the forced convection generated by the cooling fan 102 has a higher flow rate than the flow of the natural convection, the pressure in the forced convection side becomes low in a boundary portion between the forced convection and the natural convection. As a result, as shown by a thin arrow in FIG. 7B, the flow of the natural convection is drawn in to the side of the forced convection, and the flow of the natural convection does not reach the upper side, so that the cooling effect of the upper side in the side of the natural convection is lowered.

Figure 8A:
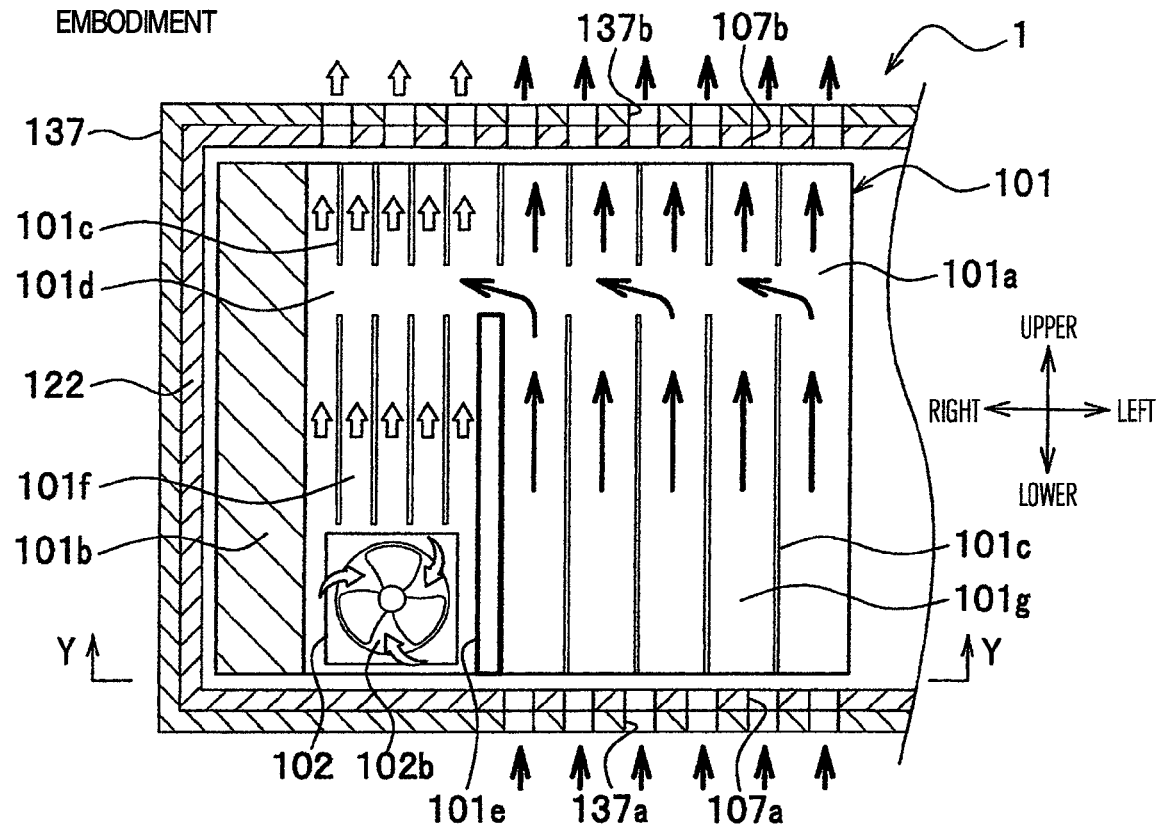
FIG. 8A is a view of a right half of a liquid crystal display device from which the rear cover is detached, as seen from the rear surface.
Figure 8B:
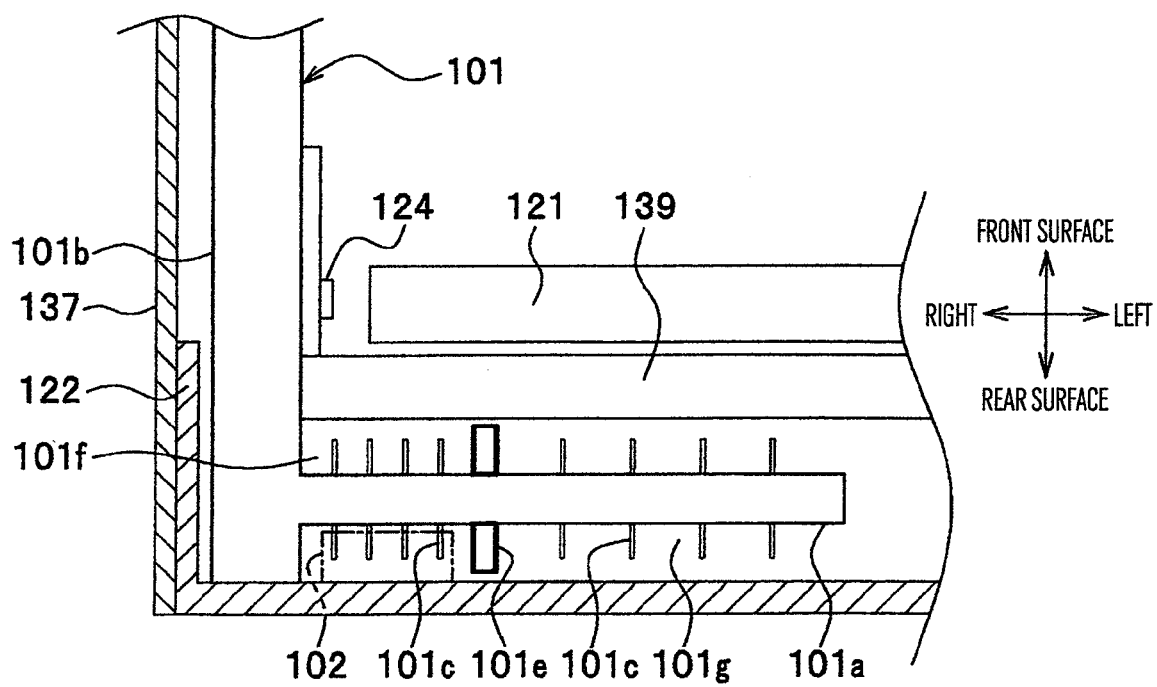
FIG. 8B is a view showing the rear surface side than a light guide plate, and corresponds to a cross sectional view along a line Y-Y in FIG. 8A.

Accordingly, in the liquid crystal display device 1 in accordance with the present invention, as shown in FIG. 8A, there is provided with the partition wall 101*e* comparting the forced convection path 101*f* and the natural convection path 101*g*. FIG. 8A is a view of an inner portion of the right half of the liquid crystal display device, as seen from the rear surface, and FIG. 8B is a cross sectional view along a line Y-Y in FIG. 8A, and is a view showing the rear surface side than the light guide plate.

In this case, FIG. 8A shows an aspect of the cross section in the vertical direction of the first frame 137 for clarifying a positional relation among the first frame 137, the air intake port 137*a* and the exhaust port 137*b*, and shows an aspect of the cross section in the vertical direction of the rear cover 122 for clarifying a positional relation among the rear cover 122, the air intake port 107*a* and the exhaust port 107*b*.

As shown in FIG. 8A, in the rear surface of the liquid crystal display device 1, the cooling fan 102 is provided near the lower end thereof, and the partition wall 101*e* is provided in the center side of the liquid crystal display device 1 of the cooling fan 102. The partition wall 101*e* is installed from the lower end of the heat sink 101 toward the upper side in parallel to the fin 101*c*. Further, the forced convection path 101*f* is formed in the end portion side than the partition wall 101*e*, and the natural convection path 101*g* is formed in the center side than the partition wall 101*e*.

In this case, FIG. 8A shows the right side of the liquid crystal display device 1, however, the liquid crystal display device 1 is provided with the cooling fan 102 and the partition wall 101*e* in the left rear surface, thereby forming the forced convection path 101*f* and the natural convection path 101*g*.

As shown in FIG. 8B, the partition wall 101*e* is provided vertically in the heat dissipation portion 101*a* of the heat sink 101 in such a manner as to divide a gap formed around the heat sink 101 in a lateral direction. Since the partition wall 101*e* is provided as mentioned above, it is possible to compart the boundary portion between the forced convection path 101*f* and the natural convection path 101*g*. Further, as shown in FIG. 8A, on the basis of the partition wall 101*e*, the air flowing through the natural convection path 101*g* does not draw in to the side of the forced convection path 101*f*, and the air flowing through the natural convection path 101*g* can reach the upper side.

Further, as shown in FIG. 8A, the forced convection path 101*f* may be structured such that an installation interval of the fin 101*f* is narrowed. If the installation interval of the fin 101*c* is made narrow, the air flowing between the fins 101*c* becomes hard to flow due to an enlargement of a resistance applied from the fin 101*c*. However, in the forced convection path 101*f*, since it is possible to flow the air so as to overcome the resistance applied from the fin 101*c*, it is possible to flow the air even if the interval between the fins 101*c* is narrow. Further, a lot of fins 101*c* can be provided by making the interval between the fins 101*c* narrow, and it is possible to improve a cooling effect.

Further, as shown in FIG. 8A, the partition wall 101*e* may be structured such as to be formed from the lower end to the portion near the upper end of the liquid crystal display device 1. In other words, a region in which the partition wall 101*e* is not formed may exist in the upper side of the natural convection path 101*g* and the forced convection path 101*f*. Further, single horizontal row of notches 101*d* may be provided in each of the fins 101*c* in the region in which the partition wall 101*e* is not formed, thereby structuring such that the air flows in the lateral direction.

In accordance with the structure mentioned above, in the upper portion than the partition wall 101*e*, the air of the natural convection is drawn in to the side of the forced convection path 101*f* having a high flow rate in the boundary portion between the forced convection path 101*f* and the natural convection path 101*g*, and conflows with the air of the forced convection through the notches 101*d*.

Further, in the natural convection path 101*g*, since an amount of the ambient air taken from the air intake ports 107*a* and 137*a* is increased in such a manner as to compensate for the air drawn in to the forced convection path 101*f*, the inflow of the ambient air is promoted, and it is possible to achieve an excellent effect that the natural convection is promoted.

In this case, since the partition wall 101*e* is formed near the upper end of the liquid crystal display device 1, all the air flowing through the natural convection path 101*g* is not drawn in to the side of the forced convection path 101*f*, but there is the air reaching the upper end. Accordingly, in cooperation with the increase of the amount of the ambient air taken from the air intake ports 107*a* and 137*a*, the cooling effect of the upper portion of the natural convection path 101*g* is not lowered.

Other Embodiment

Figure 9A:
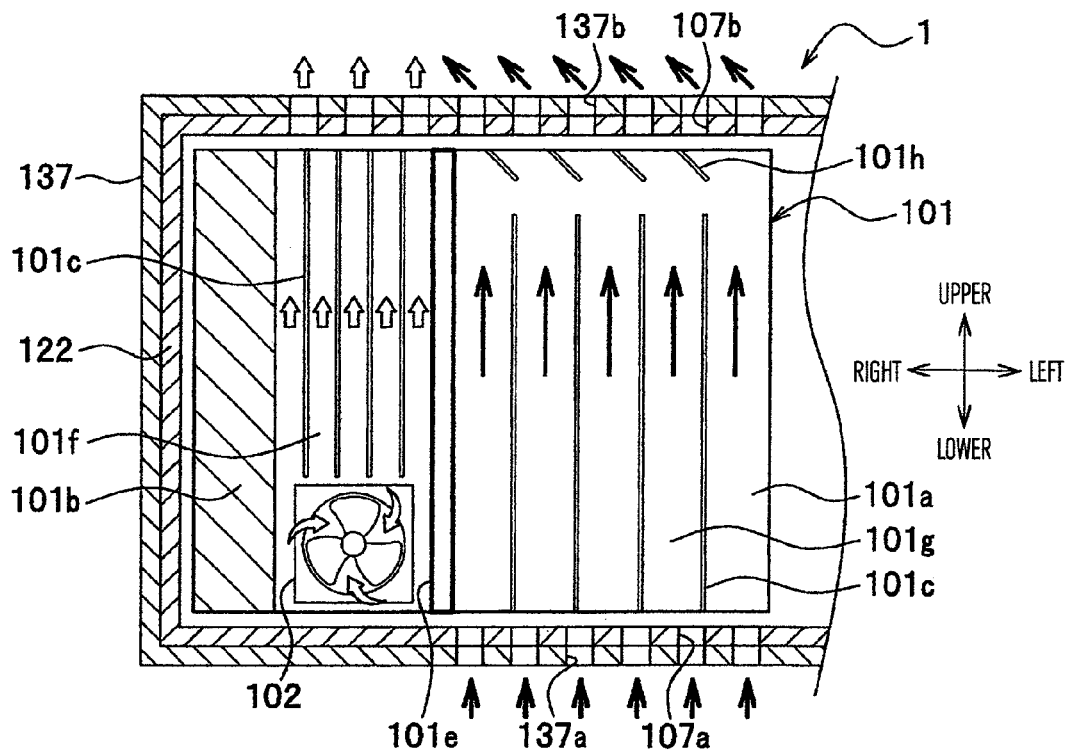
FIG. 9A is a view showing a louver in the liquid crystal display device from which the rear cover is detached.
Figure 9B:
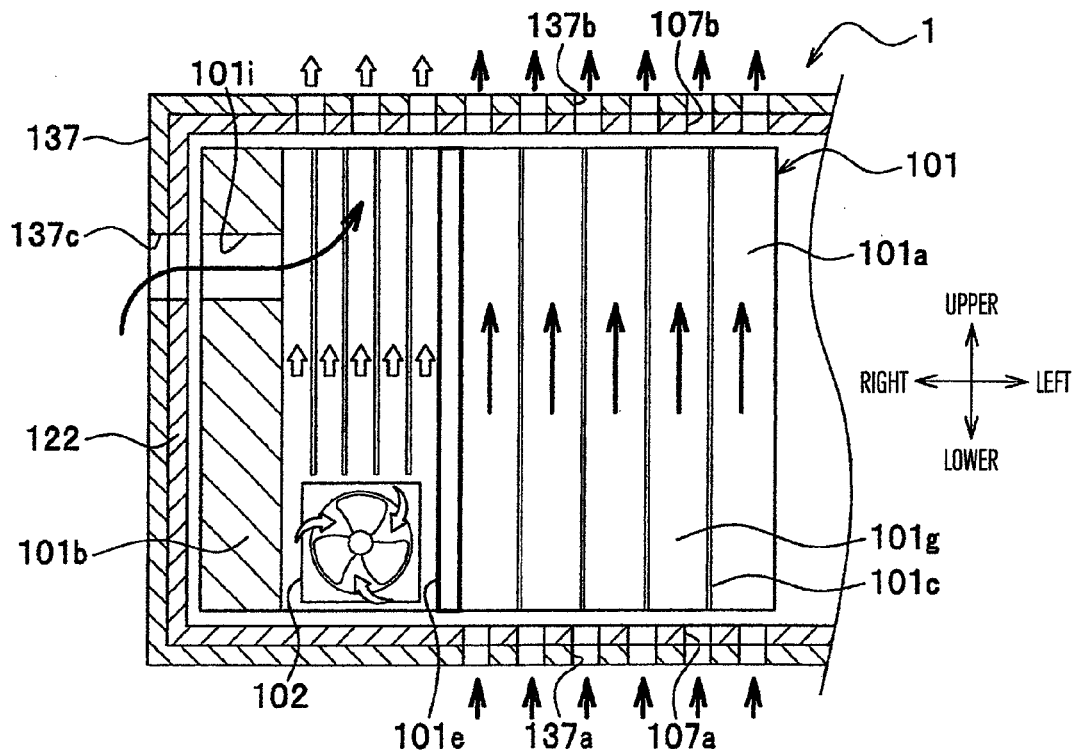
FIG. 9B is a view showing a block air intake port in the liquid crystal display device from which the rear cover is detached.

FIGS. 9 and 10 are views showing the other embodiment of the present embodiment. FIG. 9A is a view showing a louver in the liquid crystal display device from which the rear cover is detached, and FIG. 9B is a view showing a heat sink air intake port in the liquid crystal display device from which the rear cover is detached.

In this case, FIGS. 9A and 9B show an aspect of the cross section in the vertical direction of the first frame 137 for clarifying a positional relation among the first frame 137, the air intake port 137*a* and the exhaust port 137*b*, and show an aspect of the cross section in the vertical direction of the rear cover 122 for clarifying a positional relation among the rear cover 122, the air intake port 107*a* and the exhaust port 107*b*.

In accordance with the other embodiment of the present embodiment, the partition wall 101*e* is provided from the lower end to the upper end of the heat sink 101, as shown in FIG. 9A. Further, a louver 101*h* is provided in the heat sink 101. The louver 101h is constituted by a plate-shaped member which is vertically provided in the heat sink 101 in the same manner as the fin 101c. Further, the louver 101h changes the flow of the air rising along the natural convection path 101g to the side of the forced convection path 101f. Accordingly, the louver 101h has a slope directed to the forced convection path 101f with respect to the fin 101c.

The louver 101h is provided in the upper end of the natural convection path 101g of the heat sink 101, and changes the flow of the air exhausted from the exhaust port 137b in the direction of the forced convection path 101f.

The air rising along the forced convection path 101f and the air rising along the natural convection path 101g are exhausted from the exhaust port 137b provided in the upper end of the liquid crystal display device 1, however, the flow rate of the air raised by the forced convection is higher than the flow rate of the air raised by the natural convection. Accordingly, the air rising along the natural convection path 101g is drawn in to the air rising along the forced convection path 101f if it is exhausted from the exhaust port 137b. Therefore, the amount of the air flowing through the natural convection path 101g is increased for compensating the air drawn in to the forced convection path 101f. Further, in the natural convection path 101g, since the amount of the ambient air taken from the air intake ports 107a and 137a is increased in such a manner as to compensate the air drawn in to the forced convection path 101f, the inflow of the ambient air is promoted. Accordingly, the natural convection in the natural convection path 101g is promoted, and the cooling effect is improved.

Further, the air rising along the natural convection path 101g is changed its flowing direction by the louver 101h, and is efficiently drawn in to the forced convection path 101f. Accordingly, since the amount of the air drawn to the forced convection path 101f after being exhausted from the exhaust ports 107b and 137b is further increased, the natural convection in the natural convection path 101g is further promoted, and the cooling effect is further improved.

Further, as shown in FIG. 9B a side air intake port 137c is open to the side surfaces of the first frame 137 and the rear cover 122, and a heat sink air intake port 101i is open to the heat transfer portion 101b of the heat sink 101. Further, the forced convection path 101f is communicated with the outer portion of the liquid crystal display device 1.

As mentioned above, on the basis of the structure in which the side air intake port 137c and the heat sink air intake port 101i are open, the air flows into the forced convection path 101f from the outer portion of the liquid crystal display device 1 via the side air intake port 137c and the heat sink air intake port 101i. Accordingly, the amount of the air flowing through the forced convection path 101f is increased, and it is possible to efficiently cool the heat sink 101.

Figure 10A:
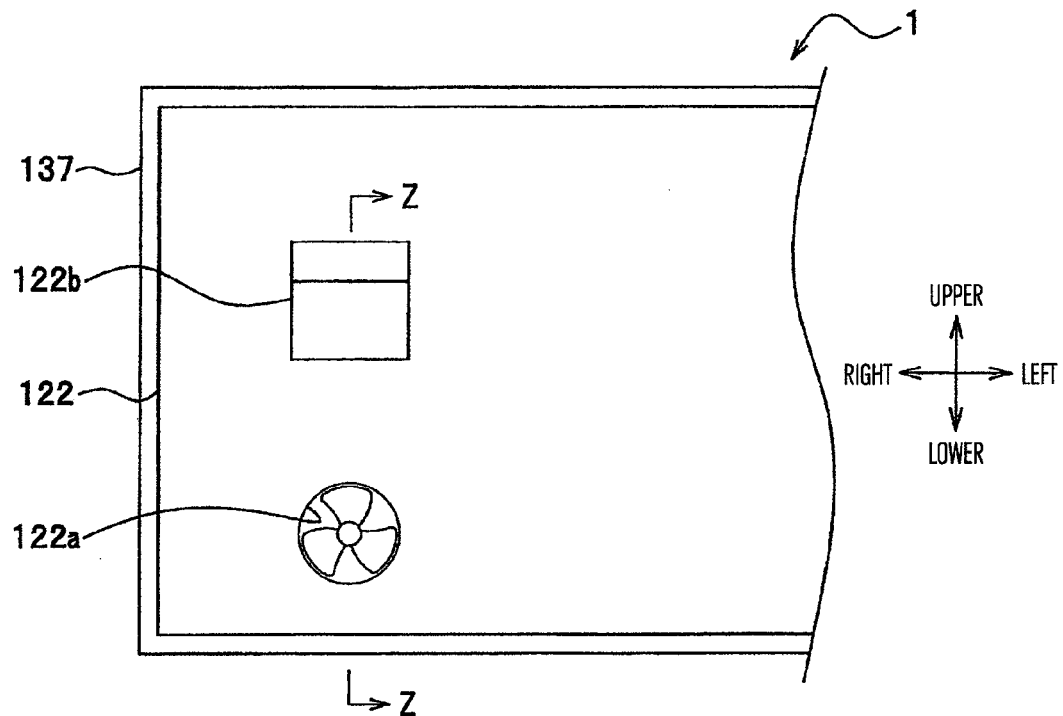
FIG. 10A is a view showing a structure in which a second exhaust port is provided in the rear cover.
Figure 10B:
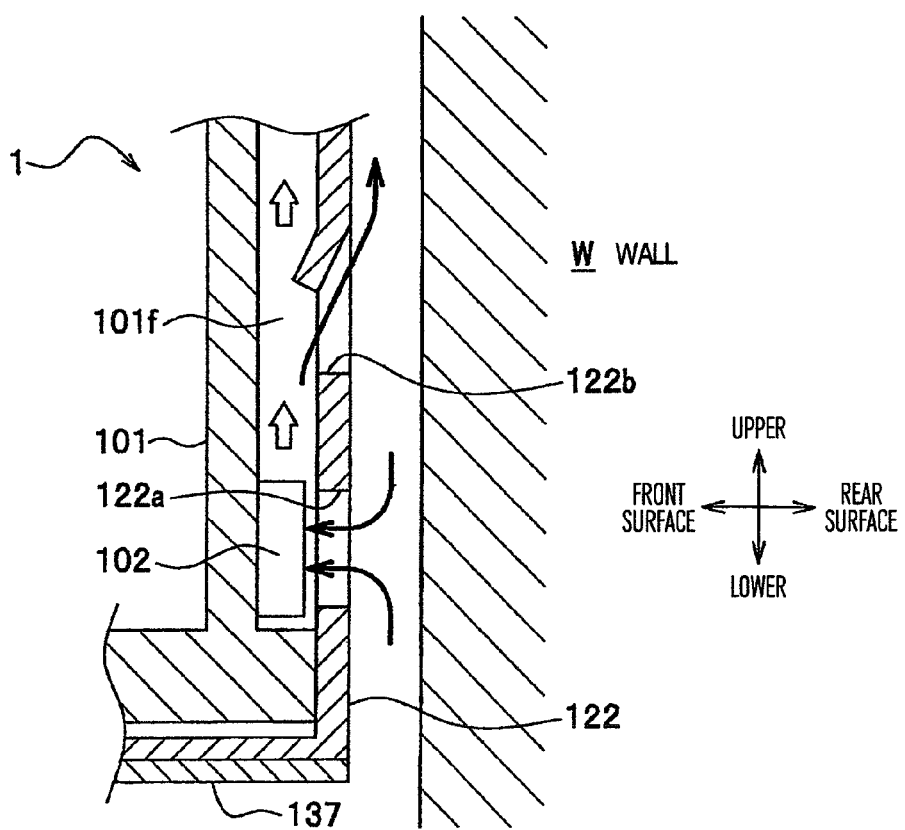
FIG. 10B is a schematic view showing a portion near a rear surface of the liquid crystal display device in a state of being hanged on a wall.

FIG. 10A is a view showing a structure in which a second exhaust port is provided in the rear cover, and FIG. 10B is a cross sectional view along a line Z-Z in FIG. 10A and is a schematic view showing a portion near the rear surface of the liquid crystal display device in a state of being hanged on a wall.

As shown in FIG. 10A, the rear cover 122 is provided with a second exhaust port 122b in an upper side of the fan air intake port 122a. Further, as shown in FIG. 10B, the second exhaust port 122b is formed as such a shape that an upper end portion slightly protrudes to an inner portion of the liquid crystal display device 1. In accordance with the structure mentioned above, a part of the air flowing through the forced convection path 101f is exhausted to the outer portion of the liquid crystal device 1 from the second exhaust port 122b so as to rise.

For example, in the case that the liquid crystal display device 1 is used in a state of being hanged on a wall W, a gap between the rear cover 122 and the wall W is narrow and the heat tends to be closed, however, the heat closed in the gap between the rear cover 122 and the wall W is exhausted by the air which is exhausted from the second exhaust port 122b as mentioned above and rises along the rear cover 122. Therefore, the heat dissipation effect from the rear cover is promoted, and it is possible to increase the cooling effect in the side of the forced convection path 101f.

Further, the structure may be made such that the second exhaust port 122b is provided near the upper end of the rear cover 122 so as to exhaust from the portion near the upper end which tends to become high temperature than the lower end. If the air is exhausted from the second exhaust port 122b, the flow caused by the exhaust air is generated. Accordingly, there is generated an effect of drawing in the peripheral air. Further, the structure may be made such as to effectively cool the high temperature portion by drawing in the peripheral cooled air to the portion near the upper end.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A liquid crystal display device comprising:
   a liquid crystal panel;
   a light guide plate provided in a rear surface of said liquid crystal panel;
   a plurality of light sources arranged in such a manner as to input a beam of light to said light guide plate from both side surfaces of said light guide plate;
   a substrate on which said light sources are mounted;
   a heat sink connected to a surface of said substrate on which said light sources are not mounted;
   a blower device for blowing an air cooling said heat sink; and
   said liquid crystal panel, said light guide plate, said light sources, said substrate, said heat sink, and said blower device being stored in a casing,
   wherein an air intake port is open to a lower side of said casing, and an exhaust port is open to an upper side of said casing,
   wherein an inner portion of said casing comprises:
   a natural convection path in which an air taken into the inner portion of said casing via said air intake port rises in a rear surface side of said light guide plate on the basis of a natural convection, and is exhausted from said exhaust port; and
   a forced convection path in which the air taken into the inner portion of said casing by said blower device rises on the basis of a forced convection caused by the ventilation of said blower device while being along said heat sink extending from the lower side toward the upper side of said casing, and is exhausted from said exhaust port, and
   wherein said natural convection path and said forced convection path are comparted by a partition wall.

2. A liquid crystal display device as claimed in claim 1, wherein a region in which said partition wall is not formed exists in an upper side of said natural convection path and said forced convection path, and said natural convection in said natural convection path is promoted by drawing in the air flowing in said natural convection path to said forced convection path, in the region in which said partition wall is not formed.

3. A liquid crystal display device as claimed in claim 1, wherein said casing includes a rear cover provided in a rear surface of said light guide plate, said heat sink had a heat dissipation portion extending to a portion between said light guide plate and said rear cover, said heat dissipation portion has a plurality of fins formed in a vertical direction, said natural convection path and said forced convection path are formed between said light guide plate and said rear cover, and the air flowing in said natural convection path and said forced convection path rises along said fins.

4. A liquid crystal display device as claimed in claim 2, wherein said casing includes a rear cover provided in a rear surface of said light guide plate, said heat sink had a heat dissipation portion extending to a portion between said light guide plate and said rear cover, said heat dissipation portion has a plurality of fins formed in a vertical direction, said natural convection path and said forced convection path are formed between said light guide plate and said rear cover, and the air flowing in said natural convection path and said forced convection path rises along said fins.

5. A liquid crystal display device as claimed in claim 3, wherein an installation interval of the fins in said forced convection path is narrower than an installation interval of the fins in said natural convection path.

6. A liquid crystal display device as claimed in claim 4, wherein an installation interval of the fins in said forced convection path is narrower than an installation interval of the fins in said natural convection path.

* * * * *